United States Patent [19]
Shibib

[11] Patent Number: 6,140,170
[45] Date of Patent: Oct. 31, 2000

[54] MANUFACTURE OF COMPLEMENTARY MOS AND BIPOLAR INTEGRATED CIRCUITS

[75] Inventor: Muhammed Ayman Shibib, Wyomissing, Pa.

[73] Assignee: Lucent Technologies Inc., Murray Hill, N.J.

[21] Appl. No.: 09/384,769

[22] Filed: Aug. 27, 1999

[51] Int. Cl.[7] .............................................. H01L 21/8238
[52] U.S. Cl. ..................... 438/203; 438/313; 438/322; 438/338
[58] Field of Search ............................. 257/47, 370, 373, 257/378, 511, 525, 555, 556; 438/203, 204, 309, 313, 318, 322, 327, 336, 338, 372

[56] References Cited

U.S. PATENT DOCUMENTS

| | | | |
|---|---|---|---|
| 4,553,318 | 11/1985 | Chandrasekhar | 438/189 |
| 4,956,305 | 9/1990 | Arndt | 438/203 |
| 5,001,073 | 3/1991 | Huie | 438/203 |
| 5,892,264 | 4/1999 | Davis et al. | 257/511 |

*Primary Examiner*—Donald L. Monin, Jr.
*Assistant Examiner*—Hoai Pham
*Attorney, Agent, or Firm*—Thomas, Kayden, Horstemeyer & Risley LLP

[57] ABSTRACT

Complementary vertical bipolar and DMOS devices are formed in a single substrate with fully isolated wells and retrograde well doping. The retrograde well doping results from a process in which the complementary wells are formed in a silicon substrate and heavily doped collector regions formed at the surface. The wafer is then inverted and the backside of the wafer ground away exposing the retrograde doped wells. With appropriate well doping complementary IGBT devices can be integrated with bipolar and/or DMOS devices in the same substrate. Trench technology is used for isolation.

8 Claims, 5 Drawing Sheets

MANUFACTURE OF COMPLEMENTARY MOS AND BIPOLAR INTEGRATED CIRCUITS

FIELD OF THE INVENTION

This invention relates to processes for making complementary bipolar devices and complementary DMOS devices in a single integrated circuit.

BACKGROUND OF THE INVENTION

Bipolar devices in state of the art circuits are used in complementary pairs, and, in high voltage circuits, are typically combined with complementary high voltage DMOS devices in the same IC. It is important that these device species be isolated, and the fabrication sequence for the different types of devices be compatible. It is highly desirable that the fabrication sequence be largely the same for each species of device. It will be appreciated by those skilled in the art that this process compatibility places severe limitations on the design and processing of the different species of devices. One of the designs of choice for bipolar devices is a buried collector structure with a vertical current flow. Vertical DMOS devices are also desirable from the standpoint of reducing device area on the chip. However to date it has been difficult to make vertically configured efficient complementary bipolar and isolated complementary DMOS devices on the same chip with a compatible process technology. In prior art processes for making vertical isolated DMOS devices the drift region of the DMOS device is typically made in an epitaxial layer with a uniform doping gradient in the vertical dimension. Graded doping of the drift region toward the drain is desirable but can only be implemented easily in a lateral device configuration. Vertical retrograde doped drift regions can be made, but typically with significant cost and difficulty.

STATEMENT OF THE INVENTION

I have developed a process for making isolated vertical DMOS devices that allows retrograde doping of the drift region of the DMOS devices, and uses cost effective and straightforward processing that is fully compatible with making efficient and reliable vertical complementary bipolar devices with buried collectors. The process is also compatible with making complementary IGBT devices and standard CMOS devices in the same chip. The process does not require any epitaxial depositions, yet it delivers vertical and lateral devices with n and/or p buried layers. An important aspect of the process is to combine the step of forming the retrograde layer for the DMOS drift region with the formation of dielectrically isolated n-wells and p-wells of the complementary pairs.

DETAILED DESCRIPTION

Figure 1:
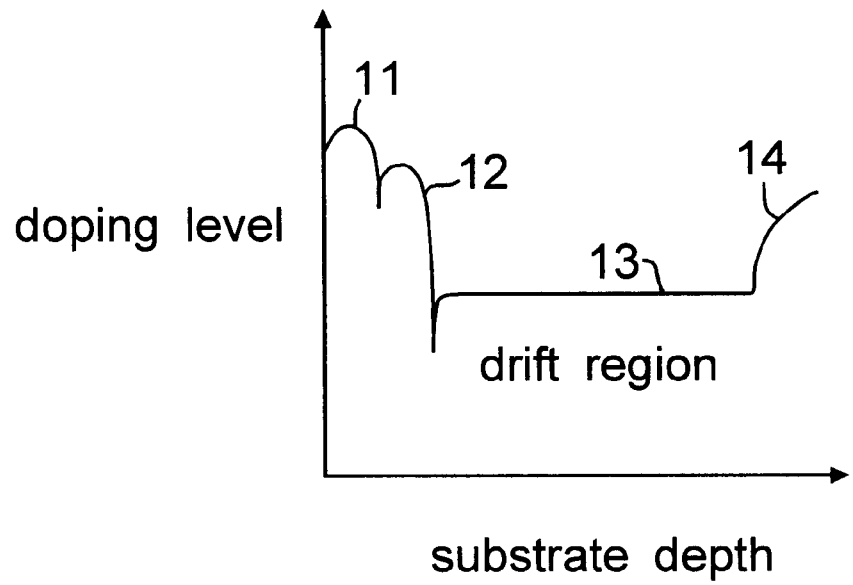
FIG. 1 is a doping profile of a typical prior art DMOS device.
Figure 2:
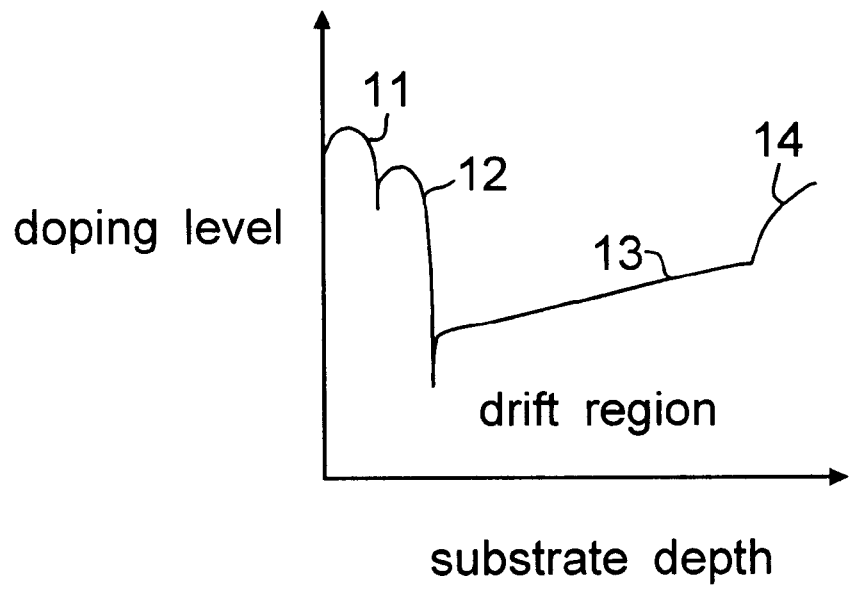
FIG. 2 is a the doping profile desired for efficient DMOS devices and enabled by the invention.

Referring to FIG. 1, a doping profile for the preferred form of the conventional prior art DMOS device is shown. The emitter doping profile is designated 11, the base profile 12, the drift region 13 and the buried collector 14. As is indicated, the drift region doping is at best uniform. The uniform doping profile for the drift region results from using an epitaxial layer grown over the buried collector. The base and emitter are implanted into the epitaxial layer. The epitaxial transistor, represented by FIG. 1 has been regarded in the art as the optimum design, given the fabrication limitations of the technology. However, from a theoretical standpoint, a high voltage transistor with a drift region as shown in FIG. 2 is ideal, i.e. a drift region with a retrograde doping profile.

The buried collector structure with a retrograde impurity region above the buried collector is fabricated according to the invention by the process now described, taken with FIGS. 3–15. It will be appreciated by those skilled in the art that the features in the drawings are not to scale. For example, the features incorporated in the substrate, e.g. impurity regions, are shown as having dimensions that are overly large compared with the thickness of the substrate. Accordingly, substrate 21 is shown broken to indicate that it extends substantially further down the page of the drawings. A typical silicon wafer may have a thickness T of the order of 500 $\mu$m or more, while a conventional impurity region has a depth of less than 10% of that thickness.

Figure 3:
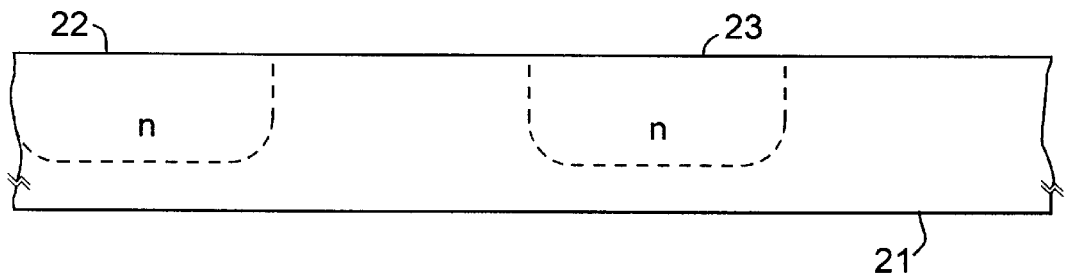
FIGS. 3–15 are schematic representations of process steps useful to obtain the isolated complementary well structure of the invention.

Referring to FIG. 3, substrate 21 is a high resistivity single crystal silicon substrate, only a portion of which is shown. An important aspect of the invention is that the substrate in which the vertically configured devices are formed does not require an epitaxial layer in order to produce a deep buried layer, e.g. a buried collector. In the usual buried collector structure, a surface implant is made for the buried collector, and the surface implant is "buried" by growing an epitaxial layer over the collector implant. Referring back to FIG. 3, N-type wells 22 and 23 are formed by deep implants and drive in the conventional way. The n-wells are typically doped with phosphorus, and have a concentration in the range $10^{15}$–$10^{17}$/cm$^3$, and a drive at 1000–1200° C. for 10–660 minutes. The depth d of the wells may vary but should be deep enough to allow exposure of the well with backside grinding as will become apparent later in this description. A useful range for the well depth is 4–15 $\mu$m, and should be more than the final thickness t of the substrate wafer. The final thickness t of the substrate wafer will become evident later.

Figure 4:
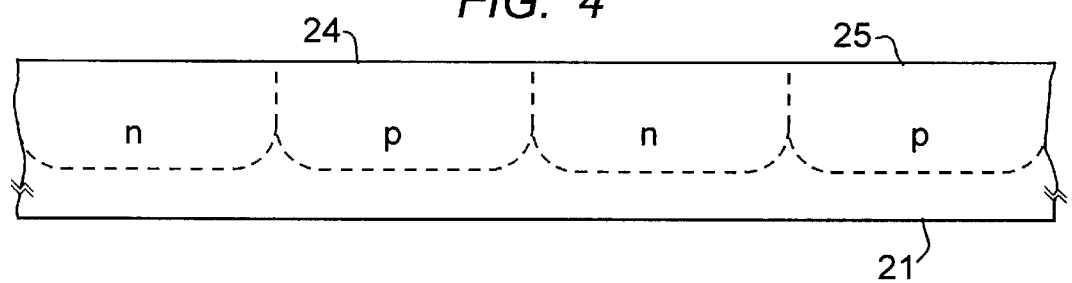

With reference to FIG. 4, p-wells 24 and 25 are formed between the n-wells. The p-wells are typically formed using boron doping at a concentration of $10^{15}$–$10^{17}$/cm$^3$, and a drive at 1000–1200° C. for 10–660 minutes. The arrangement shown, with alternating p-wells and n-wells is the usual case. However, complementary structures can also be formed with other sequences, e.g. two adjacent n-wells alternating with two p-wells. Techniques for forming complementary wells are well known to those skilled in the art and need not be described in detail here.

For clarity, in understanding the figures and the sequence of process steps they represent, the reference numbers shown in each figure are for elements that change from the last figure. As mentioned above, the elements of the figures are not necessarily drawn to scale. The dimensions of the impurity regions shown are standard, and thus well known in the art. The views shown as representing process steps are section views, to reveal the development of various impurity regions within the substrate. In plan view, the wells 22–25 typically have a quadrilateral perimeter, often a square perimeter.

Figure 5:
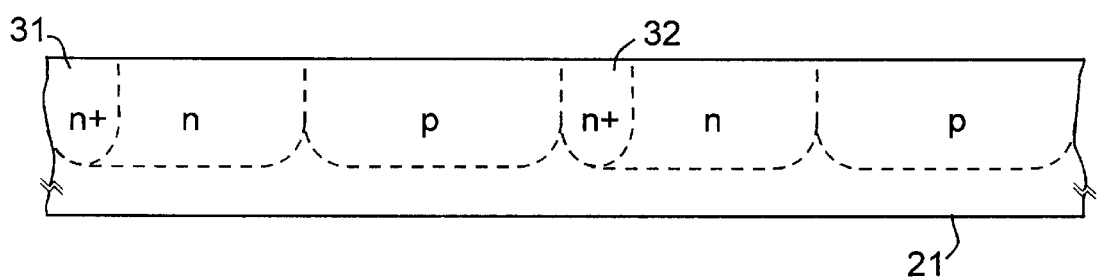
Figure 6:
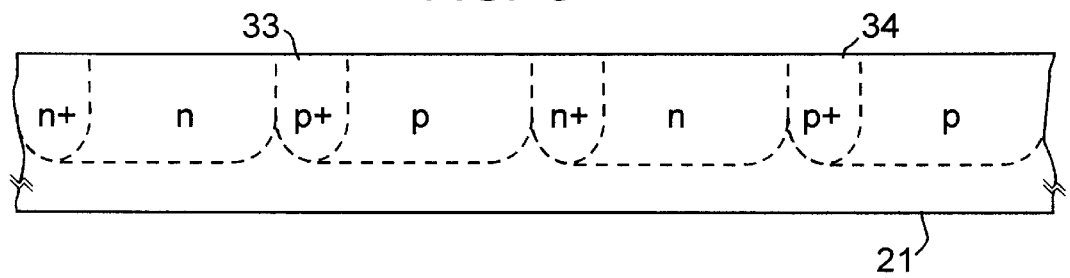

The next step in the inventive sequence is to form a sinker to the buried impurity regions. A deep, narrow n+ implant is made in regions 31 and 32 as shown in FIG. 5. The doping level for these regions is relatively high, e.g. $2 \times 10^{18}$ atoms/cm$^3$ or greater. The depth of these implants should be sufficient to allow access to these doped region from the wafer backside using a conventional collector contact. This, in principle, suggests that they can be substantially less than the well depth. However, it is preferred that the sinker implant depth be at least 75%, and more preferably 90%, of the well implant depth. Referring to FIG. 6, the corresponding sinker implants 33 and 34 for the p-wells are formed in a similar manner.

Figure 7:
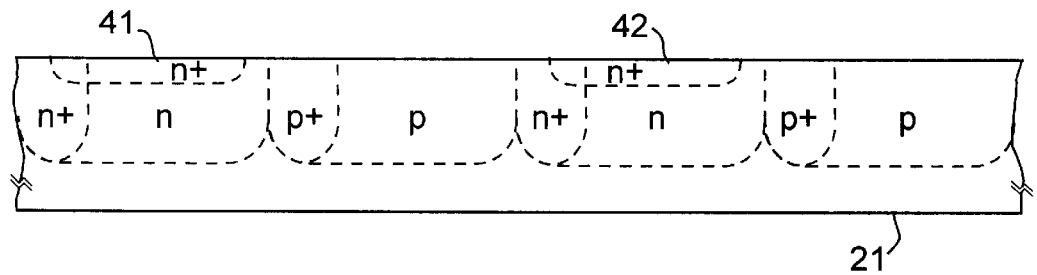
Figure 8:
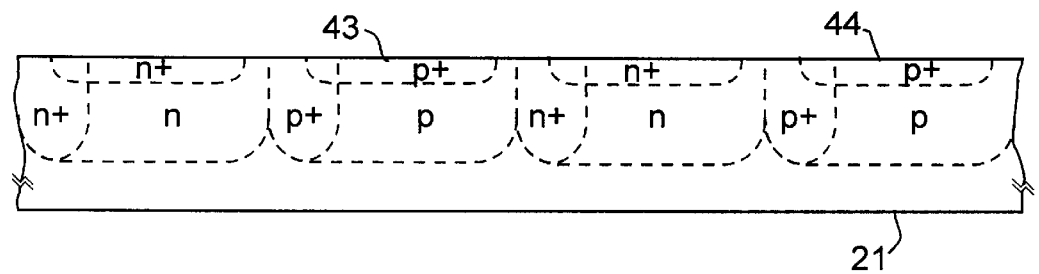

The buried impurity regions that are to serve as collectors/drains are formed with relatively shallow implants, in contrast with the usual buried collector structure which requires a heavy deep implant. For the n-wells the n+ collectors/drains 41 and 42 are shown in FIG. 7. FIG. 8 shows the p+ collectors/drains 43 and 44 for the p-wells. Appropriate doping levels for these regions is in the range $10^{18}$–$10^{20}$/cm$^3$. The depth of these impurity regions, as related to the depth d of the wells in which they are formed, determines the space remaining for device fabrication. Therefore the depth of impurity regions 41, 42, 43 and 44 is preferably less than 0.5 d.

Figure 9:
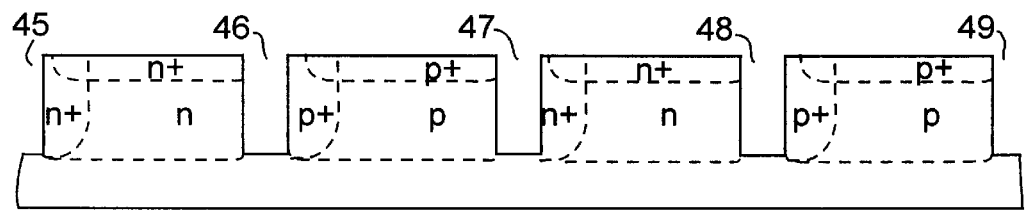
Figure 10:
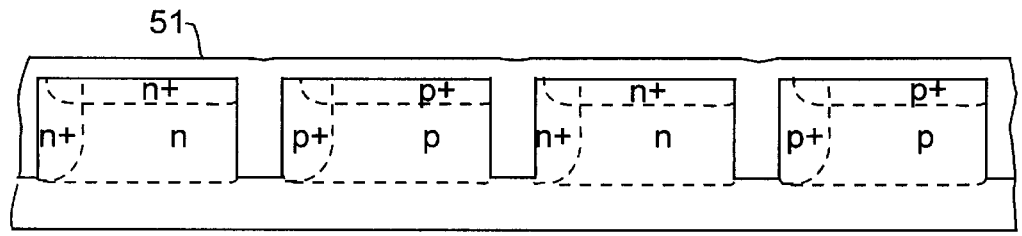

The isolation between adjacent wells can be provided by any suitable means, e.g. junction isolation or oxide isolation, but is preferably implemented using trench isolation. Trench techniques in silicon technology were developed both for isolation and for making trench capacitors for memory devices. Thus the trench technology is well known and well developed. Referring to FIG. 9, narrow deep trenches 45, 46, 47, 48, and 49 are made using conventional anisotropic plasma etching. The depth of the trenches preferably is approximately the same as the depth of the well drive, or slightly less. The trenches are then coated or filled with SiO$_2$ by conventional CVD deposition, or is by a combination of SiO$_2$ and polysilicon. The SiO$_2$ layer and the fill is shown at 51 in FIG. 10. Layer 51 can be grown, or partially grown, if desired.

Figure 11:
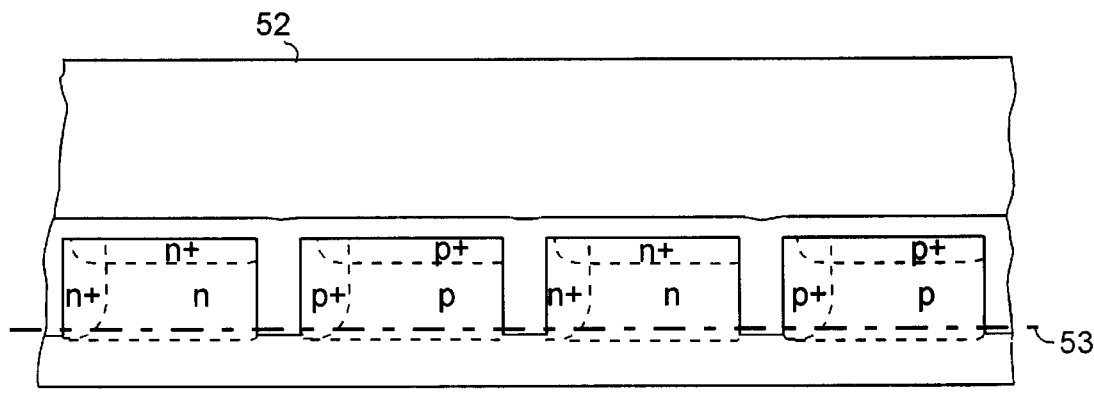

The handle wafer 52 is then attached to the processed substrate as shown in FIG. 11. The handle wafer may be silicon or polysilicon. The bonding of these wafers is easily accomplished using heat and pressure. The backside of the processed silicon wafer is then removed to the plane indicated by dashed line 53 of FIG. 11. This step is typically performed by chemical mechanical polishing (CMP) or mechanical polishing, or a combination of both. Techniques and equipment for achieving this are well known and commercially available. This step reduces the thickness of the silicon wafer from the original thickness T to the final thickness t. The thickness t may be less than 0.03T.

Figure 12:
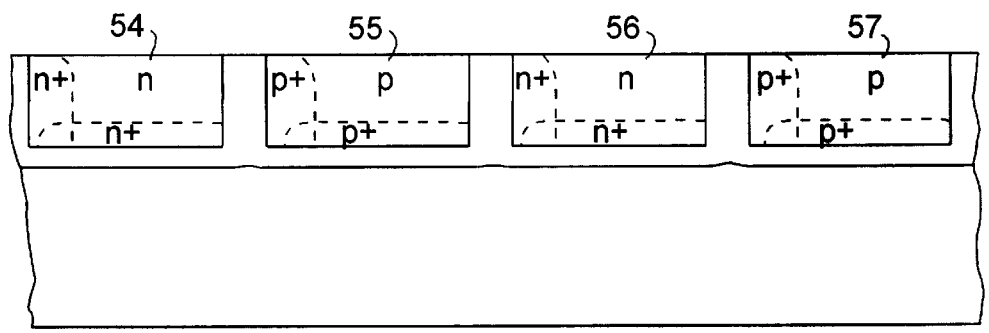

The structure left after grinding the backside of the original processed silicon wafer is shown in FIG. 12, with n-wells 54 and 56, and p-wells 55 and 57. The wells are fully isolated, and each has a buried heavily doped layer. An important feature of these wells is that they have retrograde doping, since the implant and drive used to form them was made from the underside of the structure shown in FIG. 12.

Figure 13:
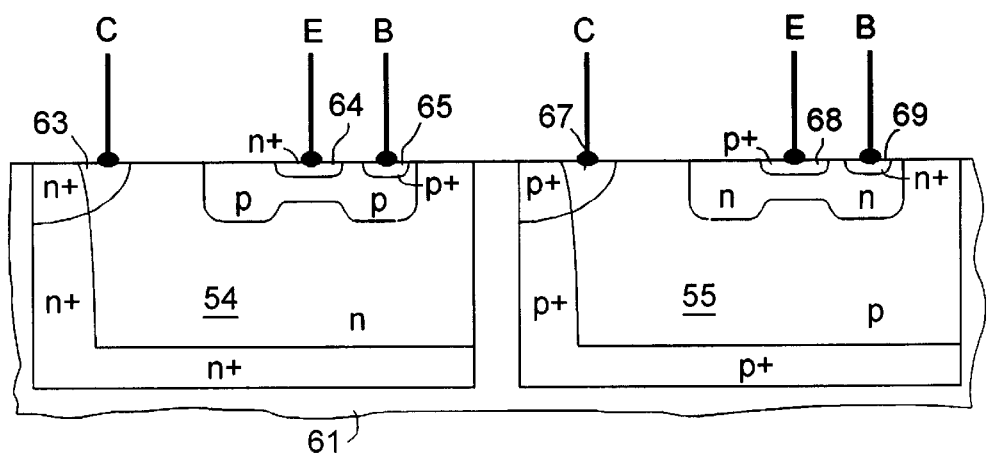

The technique for making the basic building blocks shown in FIG. 12 is an important element of the invention. With this basic substrate, a variety of efficient, vertically configured, devices can be made using standard fabrication techniques. FIG. 13 shows a pair of complementary bipolar transistors formed in adjacent tubs 54 and 55 of substrate 61. For convenience in illustrating these structures the tub is shown cut away from the larger substrate and handle wafer. The n-p-n transistor, formed in tub 54, comprises n+ emitter 64, base p-region with base contact 65, and n+ collector contact 63. The p-n-p transistor, formed in tub 55, comprises p+ emitter 68, base n-region with base contact 69, and p+ collector contact 67. The n-drift region for the n-p-n transistor and the p-drift region for the p-n-p- transistor is the region marked n in the n-p-n transistor, and the region marked p in the p-n-p- transistor. This region has retrograde doping as shown in FIG. 2, and is the ideal structure for this type of device. The complementary vertical bipolar devices are made by the steps of implanting a p-type base region in selected n-wells, implanting an n-type base region in selected p-wells, implanting an n+ emitter region in the p-type base regions, and implanting a p+ emitter region in the n-type base regions. Appropriate doping levels for emitter regions 64 and 68 are $10^{18}$–$10^{20}$/cm$^3$, for the p- and n-type base regions $10^{16}$–$10^{18}$/cm$^3$, and for the collector contact $10^{18}$–$10^{20}$/cm$^3$.

Figure 14:
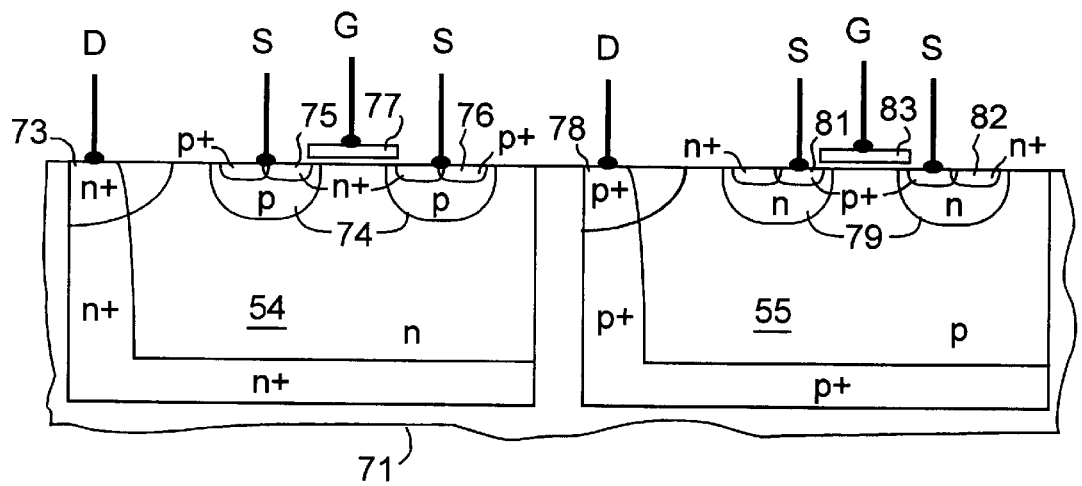

The corresponding complementary vertical DMOS devices are shown in FIG. 14, fabricated in substrate 71 with adjacent n- and p-type tubs represented by 54 and 55. The n-channel DMOS device is formed in tub 54 with the source comprising p+ and n+ regions 75 and 76, p-body region 74, n+ drain contact region 73, and silicon gate 77. The p-channel DMOS device is formed in tub 55 with p+ source region 81, n-body region 79, p+ drain contact 78, and silicon gate 83. These devices are made by the steps of forming the silicon gate over selected n-wells and p-wells, implanting the n- and p-channel regions 74 and 79, and implanting the source regions in the channel regions as shown. Suitable doping levels for source regions 75, 76 and 81 is in the range $10^{18}$–$10^{20}$/cm$^3$, for body regions 74 and 79, $10^{15}$–$10^{17}$/cm$^3$, and for drain contacts 73 and 78, $10^{18}$–$10^{20}$/cm$^3$.

Figure 15:
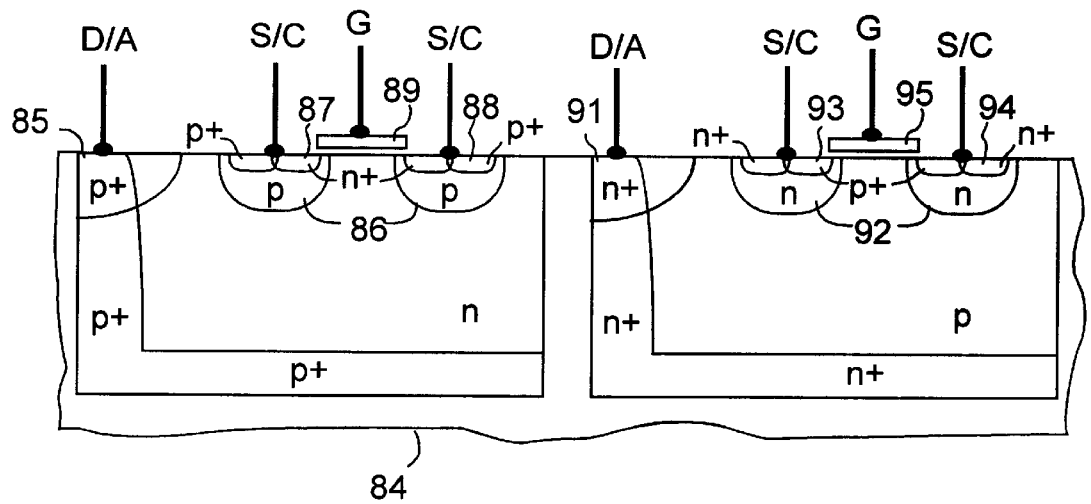

The isolated retrograde doped wells of the invention can also be adapted for complementary insulated gate bipolar transistors (IGBTs). A pair of complementary IGBT devices, using the well structure of the invention, is shown in FIG. 15. Here the wells have opposite doping as compared with those in FIG. 12, i.e. the wells are p-type with n+ buried layers, or n-type with p+ buried layers. This structure is easily made using the technique of the invention by using p-type doping for regions 22 and 23 in the process step represented by FIG. 3, and n-type doping for regions 24 and 25 in the processing step represented by FIG. 4. The n-channel IGBT is formed in the well on the left side of substrate 84, and comprises drain/anode region 85, p-type base region 86, source/cathode comprising n+/p+ regions 87 and 88, and gate 89. The p-channel IGBT is formed in the well on the right side of substrate 84, and comprises drain/anode region 91, n-type base region 92, source/cathode comprising p+/n+ regions 94 and 94, and gate 95. The complementary vertical IGBT devices are made by the steps of forming a silicon gate on the n-wells with buried p+ regions and the p-wells with buried n+ regions, forming p-type base regions in the n-wells, forming n-type base regions in the p-wells, forming n-type source regions in the p-type base regions, and forming p-type source regions in the n-type base regions. Suitable doping levels for source regions 87, 88, 93 and 94 is in the range $10^{18}$–$10^{20}$/cm$^3$, for regions 86 and 92, $10^{15}$–$10^{17}$/cm$^3$, and for anode contacts 85 and 91, $10^{18}$–$10^{20}$/cm$^3$.

It will be recognized by those skilled in the art that a deep impurity region, for example the n-wells and p-wells described above, will intrinsically have a doping profile in which the impurity concentration decreases with depth. When that substrate is inverted, as in the method of the invention, the doping profile increases with depth. Thus the desired retrograde doping profile for the deep wells, and for the drift regions of devices formed in those wells, inherently results from the process sequence described above.

It is also apparent to those skilled in the art that the steps as described above for forming complementary elements of the device structure, i.e. implanting n-type impurities followed by implanting p-type impurities, are not necessarily sequential, i.e. can be performed in either order.

The n+ and p+ contact regions that extend to the buried n+ and p+ regions are shown to one side of the n- and p-wells. They may be formed along a portion of the perimeter of the wells, as shown, or may extend around the whole well.

Various additional modifications of this invention will occur to those skilled in the art. All deviations from the specific teachings of this specification that basically rely on the principles and their equivalents through which the art has been advanced are properly considered within the scope of the invention as described and claimed.

What is claimed is:

1. A method for the manufacture of complementary integrated circuit devices comprising the steps of:
   (a) providing a silicon substrate, said silicon substrate having a surface and a backside, and a thickness T, as measured between said surface and said backside,
   (b) implanting n-type impurities into selected regions of the surface of said silicon substrate to form a plurality of n-wells, said n-wells having a quadrilateral shaped perimeter, and extending into said silicon substrate to depth d,
   (c) implanting p-type impurities into selected regions of a silicon substrate to form a plurality of p-wells, said p-wells having a quadrilateral shaped perimeter, and extending into said silicon substrate to depth d,
   (d) implanting an n+ contact into at least a portion of said perimeter of each of said n-wells, said n+ contact extending to a depth of approximately d,
   (e) implanting a p+ contact into at least a portion of said perimeter of each of said p-wells, said p+ contact extending to a depth of approximately d,
   (f) implanting an n+ impurity region into each n-well to a depth of less than 0.5 d,
   (g) implanting a p+ impurity region into each p-well to a depth of less than 0.5 d,
   (h) forming isolation regions around the perimeter of each of said n-wells and p-wells,
   (i) forming an oxide layer on the surface of said silicon substrate,
   (j) attaching the surface of said silicon substrate to a handle wafer, and
   (k) grinding the backside of said silicon substrate to a depth of at least T−d to expose said n-wells and p-wells.

2. The method of claim 1 wherein steps (b) and (c), steps (d) and (e), and steps (f) and (g) are not sequential.

3. A method for the manufacture of complementary bipolar transistors comprising the steps of:
   (a) providing a silicon substrate, said silicon substrate having a surface and a backside, and a thickness T, as measured between said surface and said backside,
   b) implanting n-type impurities into selected regions of the surface of said silicon substrate to form a plurality of n-wells, said n-wells having a quadrilateral shaped perimeter, and extending into said silicon substrate to depth d,
   (c) implanting p-type impurities into selected regions of a silicon substrate to form a plurality of p-wells, said p-wells having a quadrilateral shaped perimeter, and extending into said silicon substrate to depth d,
   (d) implanting an n+ contact into at least a portion of said perimeter of each of said n-wells, said n+ contact extending to a depth of approximately d,
   (e) implanting a p+ contact into at least a portion of said perimeter of each of said p-wells, said p+ contact extending to a depth of approximately d,
   (f) implanting an n+ impurity region into each n-well to a depth of less than 0.5 d,
   (g) implanting a p+ impurity region into each p-well to a depth of less than 0.5 d,
   (h) forming a trench around the perimeter of each of said n-wells and p-wells,
   (i) forming an oxide layer in said trench and on the surface of said silicon substrate,
   (j) attaching the surface of said silicon substrate to a handle wafer,
   (k) grinding the backside of said silicon substrate to a depth of at least T−d to expose said n-wells and p-wells,
   (l) implanting a p-type base region in selected n-wells,
   (m) implanting an n-type base region in selected p-wells,
   (n) implanting an n+ emitter region in said p-type base regions,
   (o) implanting a p+ emitter region in said n-type base regions.

4. The method of claim 2 wherein steps (b) and (c), steps (d) and (e), steps (f) and (g), steps (l) and (m), and steps (n) and (o) are not sequential.

5. A method for the manufacture of complementary DMOS devices comprising the steps of:
   (a) providing a silicon substrate, said silicon substrate having a surface and a backside, and a thickness T, as measured between said surface and said backside,
   (b) implanting n-type impurities into selected regions of the surface of said silicon substrate to form a plurality of n-wells, said n-wells having a quadrilateral shaped perimeter, and extending into said silicon substrate to depth d,
   (c) implanting p-type impurities into selected regions of a silicon substrate to form a plurality of p-wells, said p-wells having a quadrilateral shaped perimeter, and extending into said silicon substrate to depth d,
   (d) implanting an n+ contact into at least a portion of said perimeter of each of said n-wells, said n+ contact extending to a depth of approximately d,
   (e) implanting a p+ contact into at least a portion of said perimeter of each of said p-wells, said p+ contact extending to a depth of approximately d,
   (f) implanting an n+ impurity region into each n-well to a depth of less than 0.5 d,
   (g) implanting a p+ impurity region into each p-well to a depth of less than 0.5 d,
   (h) forming a trench around the perimeter of each of said n-wells and p-wells,
   (i) forming an oxide layer in said trench and on the surface of said silicon substrate,
   (j) attaching the surface of said silicon substrate to a handle wafer,
   (k) grinding the backside of said silicon substrate to a depth of at least T−d to expose said n-wells and p-wells,
   (l) forming a silicon gate on selected n-wells and selected p-wells, (m) implanting a p-type channel region in selected n-wells, (n) implanting an n-type channel region in selected p-wells, (o) implanting an n+ source region in said p-type channel regions, and (p) implanting a p+ source region in said n-type channel regions.

6. The method of claim 5 wherein steps (b) and (c), steps (d) and (e), steps (f) and (g), steps (m) and (n), and steps (o) and (p) are not sequential.

7. A method for the manufacture of complementary bipolar transistors, complementary DMOS transistors, and complementary IGBT devices in the same substrate comprising the steps of:

(a) providing a silicon substrate, said silicon substrate having a surface and a backside, and a thickness T, as measured between said surface and said backside, (b) implanting n-type impurities into selected regions of the surface of said silicon substrate to form a plurality of n-wells, said n-wells having a quadrilateral shaped perimeter, and extending into said silicon substrate to depth d, (c) implanting p-type impurities into selected regions of a silicon substrate to form a plurality of p-wells, said p-wells having a quadrilateral shaped perimeter, and extending into said silicon substrate to depth d, (d) implanting n+ contacts into:
  i. at least a portion of said perimeter of a first group of n-wells,
  ii. at least a portion of said perimeter of a second group of said p-wells,
said n+ contact extending to a depth of approximately d, (e) implanting p+ contacts into:
  i. at least a portion of said perimeter of a first group of said p-wells,
  ii. at least a portion of said perimeter of a second group of selected n-wells,
said p+ contacts extending to a depth of approximately d, (f) implanting n+ impurity regions into:
  i. said first group of n-wells,
  ii. said second group of p-wells,
said n+ impurity regions extending to a depth of less than 0.5 d, (g) implanting p+ impurity regions into:
  i. said second group of n-wells,
  ii. said first group of p-wells,
said p+ impurity regions extending to a depth of less than 0.5 d, (h) forming a trench around the perimeter of each of said n-wells and p-wells, (i) forming an oxide layer in said trench and on the surface of said silicon substrate, (j) attaching the surface of said silicon substrate to a handle wafer, (k) grinding the backside of said silicon substrate to a depth of at least T−d to expose said n-wells and p-wells, (l) implanting a p-type base region in first selected n-wells of said first group of n-wells, (m) implanting an n-type base region in first selected p-wells of said first group of p-wells, (n) implanting an n+ emitter region in said p-type base regions, (o) implanting a p+ emitter region in said n-type base regions, (p) forming a silicon gate on second selected n-wells of said first group of n-wells and on second selected p-wells of said first group of p-wells, (q) implanting a p-type channel region in said second selected n-wells, (r) implanting an n-type channel region in said second selected p-wells, (s) implanting an n+ source region in said p-type channel regions, (t) implanting a p+ source region in said n-type channel regions, (u) forming a silicon gate on said second group of n-wells and said second group of p-wells, (v) forming a p-type base region in said second group of n-wells, (w) forming an n-type base region in said second group of p-wells, (x) forming an n-type source region in said p-type base regions, and (y) forming a p-type source region in said n-type base regions.

8. The method of claim 7 wherein steps (b) and (c), steps (d) and (e), steps (f) and (g), steps (l) and (m), steps (n) and (o), steps (q) and (r), steps (s) and (t), steps (v) and (w,) and steps (x) and (y) are not sequential.

* * * * *